United States Patent [19]

Hulshof

[11] Patent Number: 4,849,652
[45] Date of Patent: Jul. 18, 1989

[54] CIRCUIT FOR PRODUCING A PERIODIC, ESSENTIALLY PARABOLIC SIGNAL

[75] Inventor: Jozef J. M. Hulshof, Eindhoven, Netherlands

[73] Assignee: U.S. Philips Corporation, New York, N.Y.

[21] Appl. No.: 123,033

[22] Filed: Nov. 19, 1987

[30] Foreign Application Priority Data

Dec. 1, 1986 [NL] Netherlands ............... 8603057

[51] Int. Cl.⁴ ............... H03K 5/00; H03K 17/56; H03K 3/02; H01J 29/56
[52] U.S. Cl. ............... 307/261; 307/262; 307/268; 307/246; 328/187; 315/368; 315/371
[58] Field of Search ............... 307/268, 261, 262, 246, 307/228, 359, 490, 260; 328/127, 187, 185, 34, 35, 36, 27, 142, 143, 144; 315/368, 371

[56] References Cited

U.S. PATENT DOCUMENTS

| | | | |
|---|---|---|---|
| 3,578,985 | 5/1971 | Edson | 307/228 |
| 3,852,674 | 12/1974 | Van Roessel | 328/127 |
| 4,064,406 | 12/1977 | Tiemeijer | 328/187 |
| 4,216,392 | 8/1980 | Valkestijn | 307/268 |
| 4,675,580 | 6/1987 | Dietz | 328/127 |
| 4,683,405 | 7/1987 | Truskalo et al. | 315/371 |
| 4,687,972 | 8/1987 | Haferl | 315/371 |

Primary Examiner—Stanley D. Miller
Assistant Examiner—Trong Q. Phan
Attorney, Agent, or Firm—Edward W. Goodman

[57] ABSTRACT

A circuit for supplying a periodic, essentially parabolic signal by squaring a sawtooth-shaped signal. For eliminating a disturbance occurring during the retrace period, a signal is generated during this period whose polarity is opposite to that of the parabolic signal occurring during the trace period, both the generated signal and the derivative with respect to time of this signal assuming values at the start and end of the retrace period which are substantially equal to the corresponding values at the same instants of the essentially parabolic signal occurring during the trace period, and of the derivative with respect to time of this signal.

19 Claims, 2 Drawing Sheets

CIRCUIT FOR PRODUCING A PERIODIC, ESSENTIALLY PARABOLIC SIGNAL

BACKGROUND OF THE INVENTION

This invention relates to a circuit for producing a periodic, especially parabolic signal at an output terminal, the circuit comprising a squaring stage having an input for receiving a sawtooth-shaped signal having a trace and a retrace, the output signal of the squaring stage having the same frequency as the received sawtooth-shaped signal and having an essentially parabola-shaped variation during the trace period.

Such a circuit is known from the U.S. Pat. No. 4,216,392 and is used, for example, for generating a control signal for an east-west modulator in a picture display arrangement and/or for dynamic focusing in such an arrangement. This control signal can have the field frequency (50 Hz according to the European television standard) or the line frequency (15.625 kHz according to the aforementioned standard) or any other suitable frequency. In the aforesaid patent the advantages of the squaring method used are disclosed, but also the disadvantage of a parabolic interference signal occurring during the retrace period, and a circuit is described therein for reducing the amplitude of this interference signal.

The invention is based on the recognition that not all detrimental effects of the occurring interference signal are obviated in the circuit of U.S. Pat. No. 4,216,392. By supressing this signal or by reducing the amplitude thereof a signal is nevertheless produced which can excite resonant circuits. Such a circuit, for example, is formed by the self-inductances and the capacitances of a line deflection circuit coupled to the east-west modulator and which can have a high quality factor Q, for example, if no high voltage generator is coupled therewith, which generator could have damped oscillations caused by the interference signal. Picture display arrangements comprising such a separate high voltage generator have often been produced of late. Owing to the aforesaid high Q a disturbance occurs on the display screen which may reach as far as one third of the height of the screen, with the lines on the screen varying in width displaying the edges of the image as undulating lines.

SUMMARY OF THE INVENTION

It is an object of the invention to provide a circuit with which the abovementioned disturbance can be eliminated better than with the known circuit. Therefore, a circuit of the aforementioned type is characterized in that the circuit further comprises a signal generator for supplying to the output terminal during the retrace period a signal whose polarity is opposite to that of the essentially parabolic signal occurring during the trace period, the signal produced by the generator as well as the derivative with respect to time of this signal assuming values at the beginning and at the end of the retrace period which are substantially equal to the values at the same instants of the essentially parabolic signal available at the output terminal during the trace period and of the derivative with respect to time of this signal.

Due to the measure in accordance with the invention the output signal of the circuit, as well as its derivative, are substantially continuous functions of time, causing resonant circuits to be very little excited. Consequently, there will hardly be any disturbance. The circuit can be implemented such that during the entire period a continuous waveform is produced, that is to say without any bends, irrespective of the repetition frequency and/or amplitude of the parabolic waveform during the trace period and/or the waveform produced by the aforedescribed generator. This result can be achieved with inexpensive components.

The circuit is advantageously characterized by means for suppressing a signal generated by the squaring stage during the retrace period and by means for conveying to the output terminal an essentially parabolic signal occurring during the trace period as well as the signal produced by the signal generator during the retrace period.

In one embodiment the circuit in accordance with the invention is characterized by an adjusting stage for inverting and adjusting the amplitude of an essentially parabolic signal produced by the squaring stage during the retrace period and for conveying the obtained signal to the output terminal. An adjustment can be found with which the waveforms occurring during both parts of the period substantially match. This works satisfactorily, especially if the incoming signal can only have one frequency.

In a further embodiment the circuit is characterized in that the signal from the signal generator is sine-shaped. With this embodiment the frequency, phase and amplitude of the sine-shaped signal are adjustable.

In a preferred embodiment the circuit is characterized in that the period of the sine-shaped signal is twice as long as the retrace period, a starting circuit being coupled to the signal generator for determining the values of the sine-shaped signal and of the derivative with respect to the time of this signal at the beginning of the retrace period and for conveying these values to the signal generator. Owing to this measure, adjusting the signal of the signal generator is not required. As the values of this signal and its derivative are fixed at the start of the retrace period, the corresponding values at the end of the retrace period are fixed as well. This is based on the assumption that the duration of the retrace period is substantially constant, even in the case of frequency variations of the incoming signal. When using this circuit in picture display arrangements this will take place rather often as for the retrace period a specified time will be chosen which with certainty includes the time required for inverting the deflecting current.

BRIEF DESCRIPTION OF THE DRAWINGS

The invention will be further described by way of example with reference to the accompanying drawing wherein.

DETAILED DESCRIPTION OF THE INVENTION

Figure 1:
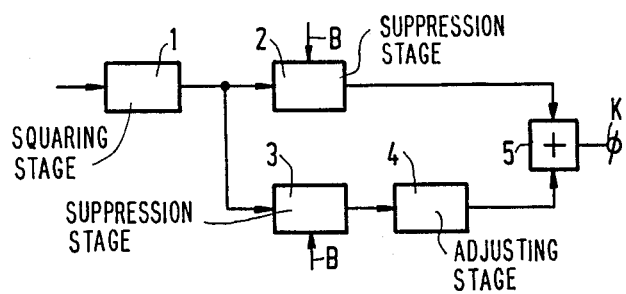
FIG. 1 shows a block diagram of a first embodiment of the circuit in accordance with the invention.

In FIG. 1 a squaring stage 1 is represented to which a periodic sawtooth-shaped signal is applied. At the output of stage 1 a signal is available having the same frequency as the applied sawtooth-shaped signal. During the greater part of the period, the trace period, wherein the applied signal shows a rising edge, as well as during the remaining part of the period, the retrace period, wherein the applied signal shows a falling edge, the signal produced by stage 1 has a parabolic variation. Both parabolas have the same polarity and substantially the same amplitude. The transition from the one to the next parabola is discontinuous. Herewith, at any rate in television engineering, the retrace period is very short relative to the trace period, that is in the order of, for example, 1 ms at a field period of 20 ms (European television standard) in the case when the signal produced by the circuit of FIG. 1 is the control circuit for an east-west modulator for correcting distortion of the picture displayed by a television receiver.

The output signal of stage 1 is applied to a first suppression stage 2 to which a suppression signal B is also applied. When a pulse occurs in signal B, stage 2 is inhibited and the output signal of stage 2 is merely formed by the parabolic signal of stage 1 occurring during the trace period. The output signal of stage 1 is likewise applied to a second suppression stage 3 which also receives signal B. When a pulse occurs in signal B, stage 3 is enabled and the output signal of stage 3 is merely formed by the parabolic signal of stage 1 occurring during the retrace period. This output signal is applied to an adjusting stage 4 wherein inversion and multiplication take place. The signals received from the outputs of stages 2 and 4 are applied to an adder stage 5. The output terminal K of the circuit is formed by an output of stage 5.

Figure 2A:
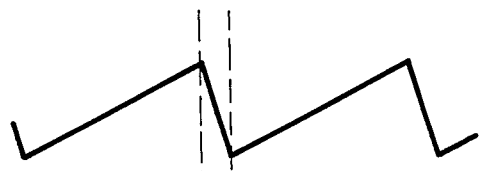
FIGS. 2a-e shows waveforms occurring in the circuit shown in FIG. 1, FIGS. 3a and 3b show block diagrams of second and third embodiments of the circuit in accordance with the invention.
Figure 2B:
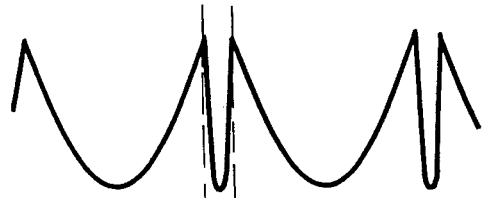
Figure 2C:
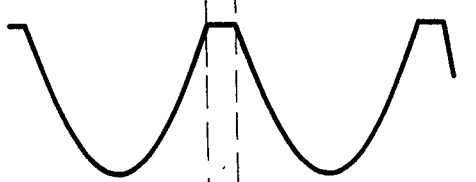
Figure 2D:
Figure 2E:
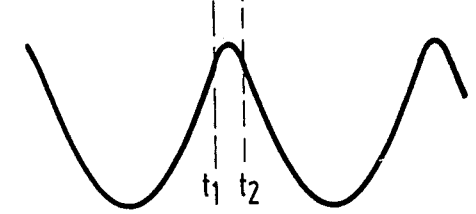

In FIG. 2a is shown the input signal and in FIG. 2b the output signal of stage 1 plotted as a function of time. FIGS. 2c and 2d show the respective output signals of stages 2 and 3 and FIG. 2e shows the output signal of the circuit. From this it is manifest that for stage 4 an adjustment can be found, more specifically an adjustment of the multiplication coefficient, with FIG. 2e showing that the waveform during the retrace period substantially matches the waveform which holds for the variation during the trace period. This implies that at the instants $t_1$ and $t_2$ of the start and the end of the retrace period, respectively, the two waveforms assume substantially the same values and that also the slopes of the curves in FIG. 2e are substantially the same at instants $t_1$ and $t_2$. Thus, at the aforementioned instants both the parabolic signal of stage 4 and the derivative with respect to time of this signal assume values which are virtually equal to the corresponding values at the same instants of the parabolic signal of stage 2 and of the derivative with respect to time of this signal. Owing to this measure the resulting curve of FIG. 2e does not show any bend.

Figure 3A:
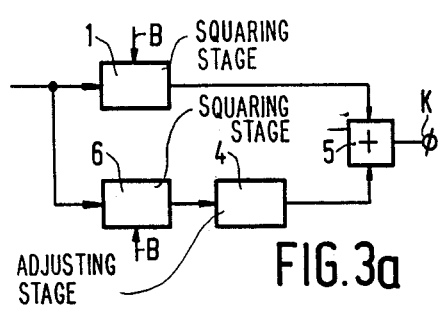

FIG. 3a shows a variant of the circuit wherein the squaring stage 1 is inhibited by the suppression pulse B causing the signal of FIG. 2c to occur, while a similar squaring stage 6 also receiving the sawtooth-shaped input signal is enabled by pulse B causing the signal of FIG. 2d to occur. The latter signal is reversed and multiplied by means of stage 4 and the signal obtained is added to the signal of FIG. 2c by means of stage 5 so as to obtain an output signal of the circuit in accordance with FIG. 2e.

Figure 3B:
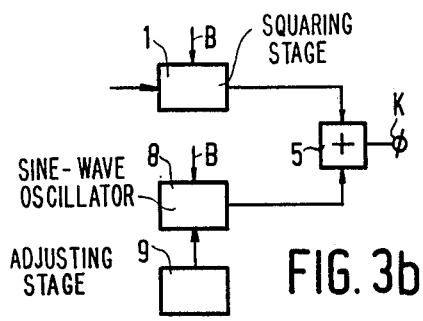

The desired continuity at instants $t_1$ and $t_2$ can also be achieved even if the signal occurring during the retrace period is not derived from the signal occurring during the trace period, as is the case in FIG. 1 and FIG. 3a, but is produced separately. A sine-shape can be very suitable therefor. FIG. 3b shows a modification of FIG. 3a wherein stage 6 is replaced by a sine-wave oscillator 8 which is enabled by signal B and which naturally receives no sawtooth-shaped signal. The frequency, the phase and the amplitude of the waveform generated by this oscillator are adjusted, if necessary, by means of an adjusting stage 9 such that the parabola and the sine form one flowing line.

Figure 4:
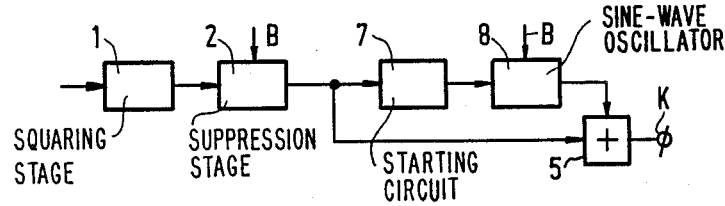
FIG. 4 shows a block diagram of a fourth embodiment of the circuit in accordance with the invention.

FIG. 4 shows a block diagram of a preferred embodiment of the circuit in accordance with the invention wherein the waveform during the retrace period again has the form of a sine wave and is generated by a separate oscillator, but wherein the aforedescribed adjustments are not required. The stages 1, 2 and 5 in FIG. 4 represent the same stages as the corresponding stages in FIG. 1. The output signal of stage 2, that is the signal of FIG. 2c is applied both to stage 5 and to a starting circuit 7 coupled to sine-wave oscillator 8. The signal generated by oscillator 8 is applied to stage 5 wherein it is added to the signal of stage 2 to obtain the circuit output signal. Oscillator 8 is preferably a start-stop-oscillator only operative during the occurrence of pulse B, that is to say between instants $t_1$ and $t_2$. Starting circuit 7 determines the values at instant $t_1$ of the signal coming from stage 2 and of the derivative with respect to time of this signal and applies these values to oscillator 8. The signal of oscillator 8 has such a frequency that the time interval between $t_1$ and $t_2$ is equal to half the period of the oscillation. At instant $t_1$ oscillator 8 starts oscillating at this frequency, with the values at that instant assumed by the signal of the oscillator and by the derivative with respect to time of this signal being the respective values conveyed by circuit 7. At instant $t_2$, that is half a period later, the sine-shaped signal assumes the same value as at instant $t_1$, the derivative having the same absolute value as at instant $t_1$ but having the opposite sign. Owing to the symmetry of the parabola with respect to the axis of symmetry passing through the centre instant of the trace period, the same holds for the derivative of the signal of FIG. 2c, this signal keeping the same value between instants $t_1$ and $t_2$. Thus the circuit of FIG. 4 fulfills the conditions of continuity. As this circuit has no adjusting means it can be used in the case where the duration of the retrace period is invariable, whereas the frequency of the incoming signal is constant or not constant.

Figure 5:
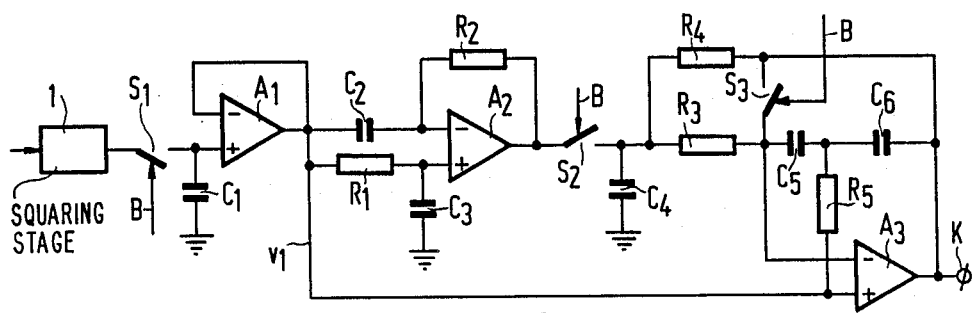
FIG. 5 shows a more detailed diagram of the circuit of FIG. 4, and FIGS. 6 and 7 show details of variants of the circuit of FIG. 5.

FIG. 5 shows in more detail an embodiment of the circuit of FIG. 4. From FIG. 5 it appears that the suppression stage 2 is implemented to comprise a switch S1, conducting during the trace period and blocked during the retrace period, and a capacitor C1. The capacitor C1 is connected to an amplifier A1 operating as a signal follower whose output voltage $v_1$ has the variation represented by FIG. 2c. During the trace period the voltage across capacitor C1 follows the variation of FIG. 2b, as amplifier A1 is a voltage source, and during the retrace period the aforesaid voltage keeps the value assumed at instant $t_1$. The starting circuit 7 comprises an amplifier A2 having an inverting input which is connected to the output of amplifier A1 via a capacitor C2 and a noninverting input which is connected to the same output via a resistor R1. A resistor R2 is inserted between an output and the inverting input of amplifier A2 and a capacitor C3 is connected between the non-inverting input of amplifier A2 and ground. Resistors R1 and R2 have substantially the same value R and capacitors C2 and C3 have substantially the same capacitance C. Under these circumstances the transfer function between the output of amplifier A1 and that of amplifier A2 appears to be equal to $1-j\omega RC$, which shows that the voltage at the output of amplifier A2 consists of two voltage components, that is to say one component which is equal to voltage $v_1$ and one component which is proportional to the derivative with respect to time of this voltage. Via a switch S2, which is blocked during the retrace period and conducting during the trace period, the voltage at the output of amplifier A2 is applied to a capacitor C4. The voltage present across this capacitor has the correct initial value for oscillator 8 at instant $t_1$.

Oscillator 8 is a sine-wave oscillator with a feedback double integrator around an amplifier A3. A series arrangement composed of two capacitors C5 and C6 and a series arrangement composed of two resistors R3 and R4 are respectively inserted between an inverting input and an output of amplifier A3. A non-inverting input of amplifier A3 is connected to the output of amplifier A1 and is also connected to the junction point of capacitor C5 and C6 via a resistor R5. The junction point of resistors R3 and R4 is connected to capacitor C4. A switch S3 is inserted between the inverting input and the output of the amplifier A3. Like the other two switches, switch S3 is controlled by the suppressing signal B, as a result of which the switches are blocked during the retrace period and conducting during the trace period. Capacitors C5 and C6 have the same capacitance C as capacitors C2 and C3 and capacitor C4 has a capacitance 2C. Resistor R5 has the same value R as resistors R1 and R2 and resistors R3 and R4 have the value 2R.

As long as switch S3 is conducting, the selective network formed by the elements R3, R4, R5, C5 and C6 is shortcircuited and amplifier A3 will function as a signal follower for signal $V_1$. The signal at the output of amplifier A3, that is the signal to terminal K, is thus the parabolic voltage occurring during the trace period. At instant $t_1$ switch S3 is blocked and the sine-wave oscillator starts oscillating, the time interval between $t_1$ and $t_2$ being equal to $2\pi RC$ and the initial values of the voltage across capacitor C4 and of the derivative with respect to time of this voltage being determined in the aforedescribed way. The sine-shaped voltage produced between instants $t_1$ and $t_2$ is present on terminal K. For voltage $v_1$ amplifier A3 is an amplifier with feedback so that the sine-shaped voltage is superposed on the substantially constant value assumed by voltage $v_1$ between the instants $t_1$ and $t_2$.

Figure 6:
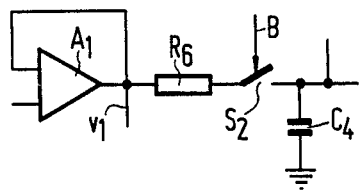

It will be evident that the various parts of the circuit of FIG. 4 can be implemented in many known ways. A disadvantage of the implementation of the starting circuit in accordance with FIG. 5 is the fact that it comprises a differentiating network C2, R2, which is sensitive to possible interference voltage peaks. In this respect an improvement and likewise a simplification of the circuit will be obtained by substituting for the elements R1, R2, C2, C3 and A2 in FIG. 5 a single resistor R6 having the value R and which is inserted between the output of amplifier A1 and switch S2 (cf. FIG. 6). During the trace period the voltages at the non-inverting input and at the output of amplifier A3 are substantially equal and, consequently, the voltage at the inverting input is substantially equal to voltage $V_1$. Capacitor C4 is charged by this voltage via resistors R6, R3 and R4. The transfer function of the network thus formed is equal to $$1/(1+j\omega RC)$$

and is by approximation equal to $1-j\omega RC$ if $\omega RC$ is many times smaller than 1, implying that the frequency of voltage $V_1$ is many times smaller than the frequency of the sine-wave oscillator. This is most certainly the case if the retrace period is very short relative to the period of the incoming signal. In an embodiment in a monitor the field frequency was 50 Hz and the interval $t_1$ and $t_2$ was 0.5 ms, the sine-wave oscillator had a frequency of 1 kHz and R was selected to be 5 k$\Omega$ and C was selected to be 15 nF. From the foregoing and more specifically the aforementioned transfer function it appears that resistor R6 has the same effect as the elements for which it was substituted.

Figure 7:
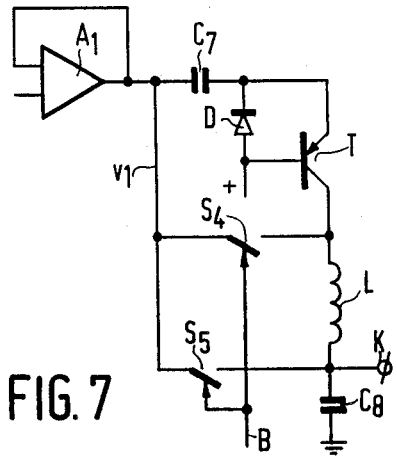

FIG. 7 shows a variant of the circuit wherein a capacitor C7, a switch S4 and a switch S5 are connected to the output of amplifier A1. The remaining connection of capacitor C7 is connected to the cathode of a diode D whose anode is connected to a positive direct voltage. The capacitor C7 is also connected to the emitter of a pnp-transistor T whose base is connected to the same positive direct voltage. The connection of switch S4 not connected to amplifier A1, the collector of transistor T as well as an end of an inductor L are interconnected. The remaining end of inductor L is connected to the connection of switch S5 not connected to amplifier A1 and to a capacitor C8 whose other side is connected to ground. Switches S4 and S5 receive the signal B. During the retrace period switch S4 is conducting while switch S5 is blocked and during the trace period switch S4 is blocked while switch S5 is conducting. The voltage across capacitor C8 is the output voltage of the circuit.

During the trace period there is a parabolic voltage $v_1$ present across capacitor C8 via the conducting switch S5. By means of diode D having the aforesaid conduction direction when the parabola has the polarity indicated in FIG. 2, the top of the parabola is kept at a fixed level. If the value of voltage $v_1$ exceeds this level incremented by the sum of the threshold voltage of diode D and the threshold voltage of the emitter-base diode of transistor T, then this transistor will be conductive. This will happen with a sufficiently large amplitude of voltage $v_1$ during the trace period in a first portion before the centre instant of this period and in a second portion after this instant. The emitter current of transistor T flows through capacitor C7 and is proportional to the derivative with respect to time of voltage $v_1$. The same holds for the collector current which is substantially equal to the emitter current and which flows through inductor L and capacitor C8. Owing to the fact that voltage $v_1$ originates from a voltage source this current does not affect the output voltage across capacitor C8. During the retrace period voltage $v_1$ causes a current to flow through inductor L and capacitor C8 via the conducting switch S4. The voltage across capacitor C8 is sine-shaped having a frequency determined by the inductance value of inductor L and the capacitance of capacitor C8. If these respective quantities L and C' are chosen such that $\pi\sqrt{LC'}$ equals the duration of the interval $t_1$ to $t_2$, this duration will be equal to half the sine-shaped period. The initial value of the output voltage at instant $t_1$ is equal to the value this voltage had just before the switches S4 and S5 were changed over and the initial value of the derivative with respect to time of the aforementioned voltage is likewise equal to the value this derivative had just before the aforesaid change-over. For the voltage across capacitor C8 and the current through inductor L will not jump.

In the preceding description several circuits are described for producing a signal having a parabolic shape during the trace period and having a shape, for example a sine-shape, smoothly running into the parabolic shape during the retrace period. The manner in which a parabolic signal generated by squaring is suppressed during the retrace period is of little importance. This can be achieved as described in FIGS. 1 and 3, or because the signal applied to stage 1 is already suppressed between the instants $t_1$ and $t_2$, having the minimum value between the aforesaid instants. This will hold for the afore-described case wherein the incoming sawtooth-shaped signal shows a rising edge during the trace period. It will be evident that the described circuits can also be used, although with obvious modifications, like the direction of conduction of diode D, in the opposite case where the aforementioned edge is falling. It will also be evident that the circuits can be used in cases when the aforesaid edge is not an exact linear function of time, for example when an S-component is present in the signal, in which case the output signal only approximates a parabolic shape during the trace period. Such a deformation of the east-west-parabola, for example with flat picture display tubes, can even be desirable.

I claim:

1. A circuit for producing a periodic, essentially parabolic signal at an output terminal comprising: a squaring stage coupled to the output terminal and having an input for receiving a sawtooth-shaped signal having a trace period and a retrace period, said squaring stage producing an output signal during said trace period having the same frequency as said sawtooth-shaped signal and having an essentially parabola-shaped variation during said trace period, a signal generator for supplying, during said retrace period, a signal whose polarity is opposite to that of said essentially parabola-shaped output signal of said squaring stage occurring during said trace period, the signal produced by said signal generator and a derivative with respect to time of said signal produced by said signal generator each having a sign and magnitude at a beginning and at an end of said retrace period which are substantially equal to the values at the same instants of said essentially parabola-shaped output signal of said squaring stage and the sign and magnitude at the same instants of a derivative with respect to time of said parabola-shaped output signal during the trace period, and means coupled to said squaring stage and said signal generator for conveying said parabola-shaped output signal of said squaring stage during said trace period and said signal produced by said signal generator during said retrace period to said output terminal to form said periodic, essentially parabolic signal at said output terminal.

2. A circuit as claimed in claim 1, wherein said conveying means comprises means coupled to said squaring stage for suppressing a signal generated by said squaring stage during said retrace period.

3. A circuit as claimed in claim 1, wherein said signal generator comprises an adjusting stage, said adjusting stage having an input coupled to an output of said squaring stage for receiving an essentially parabola-shaped signal produced by said squaring stage during said retrace period, and an output coupled to said conveying means, said adjusting stage converting and adjusting an amplitude of said essentially parabola-shaped signal produced by said squaring stage during said retrace period.

4. A circuit as claimed in claim 2, characterized in that the signal produced by the signal generator is sinusoidal.

5. A circuit as claimed in claim 4, wherein the circuit further comprises means coupled to said signal generator for adjusting the frequency, phase and amplitude of the sinusoidal signal.

6. A circuit as claimed in claim 4, characterized in that the period of the sinusoidal signal is twice as long as the retrace period, and said circuit further comprises a starting circuit coupled to said signal generator for setting the sign and magnitude of the sinusoidal signal and a derivative with respect to time of said sinusoidal signal at the beginning of the retrace period.

7. A circuit as claimed in claim 6, characterized in that said starting circuit has an input coupled to the output of said squaring stage for receiving said parabola-shaped signal generated by said squaring stage during said trace period, said starting circuit having means for determining the sign and magnitude of said parabola-shaped signal and the sign and magnitude of a derivative of said parabola-shaped signal at the end of said trace period, and said starting circuit using said determined sign and magnitude for setting the signs and magnitudes of said sinusoidal signal of said signal generator and the sign and magnitude of a derivative of said sinusoidal signal at the beginning of the retrace period.

8. A circuit as claimed in claim 7, wherein the starting circuit comprises an amplifier having an inverting input coupled to the squaring stage via a first capacitor and a non-inverting input coupled to the squaring stage via a first resistor which supplies the essentially parabolic signal occurring during the trace period, means connecting a second resistor between the inverting input and an output of the amplifier, means coupling the amplifier output to the signal generator via a switch that is closed during the trace period and is open during the retrace period, a second capacitor being connected to the non-inverting input of the amplifier, both capacitors having substantially the same capacitance value and both resistors having substantially the same resistance value.

9. A circuit as claimed in claim 7, characterized in that said starting circuit comprises a resistor having a first end coupled to said input and a second end coupled to a switch, said switch being coupled to said signal generator, said switch being closed during the trace period and being open during the retrace period.

10. A circuit as claimed in claim 8, characterized in that the signal generator comprises a capacitor connected to said switch, a voltage across the capacitor at the beginning of the retrace period being indicative of the sign and magnitude of the sinusoidal signal and the derivative with respect to time of said sinusoidal signal.

11. A circuit as claimed in claim 4, characterized in that said signal generator comprises a start-stop-oscillator made operative at the beginning of the retrace period and inoperative at the end of the retrace period, said start-stop-oscillator having an output coupled to said conveying means.

12. A circuit as claimed in claim 11, characterized in that the start-stop-oscillator comprises an amplifier, a frequency selective network short-circuited during the retrace period being connected between a feedback input and and output of the amplifier, said amplifier output forming the output terminal of the circuit, a further input of the amplifier being coupled to an output of the squaring stage which supplies the essentially parabolic signal occurring during the trace period.

13. A circuit as claimed in claim 1, wherein the signal generator produces a sinusoidal signal and includes an input coupled to an output of said squaring stage for receiving said parabola-shaped signal during said trace period, said signal generator and said conveying means together comprising: a series arrangement, including a first capacitor, a current source, an inductor and a second capacitor, coupled to said input, a first switch open during the trace period and closed during the retrace period and connected in parallel with a first series subarrangement including the first capacitor and the current source, and a second switch closed during the trace period and open during the retrace period and connected in parallel with a second series subarrangement including the first capacitor, the current source and the inductor, wherein a junction point of the inductor, the second capacitor and the second switch forms the output terminal of the circuit.

14. A circuit as claimed in claim 9, characterized in that the signal generator comprises a capacitor connected to the switch, the voltage across the capacitor at the beginning of the retrace period being indicative of the sign and magnitude of the sinusoidal signal and the sign and magnitude of the derivative with respect to time of said sinusoidal signal.

15. A circuit for producing a periodic parabolic signal from a sawtooth signal having a trace period and a retrace period comprising: an input terminal for receiving said sawtooth signal, a squaring stage having an input coupled to the input terminal and means for producing at an output of the squaring stage a parabolic signal during said trace period, an output terminal for supplying said periodic parabolic signal, a signal generator for producing during the retrace period a signal whose polarity is opposite to that of the parabolic signal produced during the trace period, the signal produced by the signal generator and a derivative with respect to time of said signal produced by the signal generator each having a sign and magnitude at the beginning and at the end of the retrace period which are substantially equal to the corresponding sign and magnitude of the parabolic signal produced by the squaring stage and the corresponding sign and magnitude of a derivative of the periodic signal at the end and the beginning of a trace period, respectively, and means for combining the parabolic signal produced during the trace period with said signal produced by the signal generator during the retrace period and supplying the combined signal to the output terminal as said periodic parabolic signal.

16. A circuit as claimed in claim 15, wherein the signal generator comprises a sinusoidal oscillator, and wherein said circuit comprises a suppression stage connected in series between the output of the squaring stage and said combining means, and means for applying control signals to the suppression stage and a control input of said sinusoidal oscillator in synchronism so as to suppress the output of the squaring stage during the retrace period and to suppress the output of the sinusoidal oscillator during the trace period.

17. A circuit as claimed in claim 15, wherein the signal generator comprises a starting circuit connected in cascade with a sinusoidal oscillator, said starting circuit having an input coupled to the output of said squaring stage, and wherein said circuit further comprises means for suppressing the output signal of the squaring stage during the retrace period, said starting circuit being responsive to both a magnitude and a time derivative of the parabolic signal appearing at the output of the squaring stage at the end of the trace period for setting the magnitude and time detivative of the sinusoidal signal produced by said sinusoidal oscillator at the beginning of the retrace period equal thereto.

18. A circuit as claimed in claim 15, wherein the signal generator comprises a further squaring stage and an adjusting stage connected in cascade to said input terminal, said squaring stage and the signal generator providing first and second parallel paths, respectively, between the input and output terminals, and synchronized means coupled to the squaring means and the signal generator for suppressing the output of the squaring stage during the retrace period and the output of the signal generator during the trace period.

19. A circuit as claimed in claim 15, wherein the signal generator produces a sinusoidal signal and includes an input coupled to an output of said squaring stage for receiving said parabola-shaped signal during said trace period, said signal generator and said combining means together comprising: a series arrangement, including a first capacitor, a current source, an inductor and a second capacitor, coupled to said input, a first controllable switch connected in parallel with a series connection of the first capacitor and the current source, a second controllable switch coupling the output of the squaring stage to the output terminal so as to bypass said series arrangement, and means for controlling said first and second controllable switches in synchronism so that the first and second controllable switches are closed and opened, respectively, during the retrace period and vice versa during the trace period, wherein said output terminal is connected to a junction point between said inductor and said second capacitor in said series arrangement.

* * * * *